(12) United States Patent
Willson et al.

(10) Patent No.: US 9,823,568 B2
(45) Date of Patent: Nov. 21, 2017

(54) ORDERING BLOCK COPOLYMERS

(71) Applicant: Board of Regents The University of Texas System, Austin, TX (US)

(72) Inventors: C. Grant Willson, Austin, TX (US); Christopher Ellison, Austin, TX (US); Michael Maher, Austin, TX (US); Christopher Bates, Austin, TX (US); Dustin Janes, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/409,125

(22) Filed: Jan. 18, 2017

(65) Prior Publication Data

US 2017/0139326 A1 May 18, 2017

Related U.S. Application Data

(63) Continuation of application No. 14/656,753, filed on Mar. 13, 2015, now Pat. No. 9,557,640.

(60) Provisional application No. 61/953,836, filed on Mar. 15, 2014.

(51) Int. Cl.
| | | |
|---|---|---|
| *G03F 7/004* | (2006.01) | |
| *G03F 7/20* | (2006.01) | |
| *G03F 7/11* | (2006.01) | |
| *G03F 7/16* | (2006.01) | |
| *C09D 153/00* | (2006.01) | |
| *G03F 7/00* | (2006.01) | |
| *B81C 1/00* | (2006.01) | |

(52) U.S. Cl.
CPC ............. *G03F 7/20* (2013.01); *C09D 153/00* (2013.01); *C09D 153/005* (2013.01); *G03F 7/0002* (2013.01); *G03F 7/11* (2013.01); *G03F 7/16* (2013.01); *B81C 1/00031* (2013.01); *B81C 2201/0149* (2013.01)

(58) Field of Classification Search
CPC . G03F 7/0002; G03F 7/20; G03F 7/11; G03F 7/165; C09D 153/00; C09D 153/005; B81C 1/000031; B81C 2201/0149
USPC .................. 430/322, 325, 270.1; 427/256
See application file for complete search history.

(56) References Cited

U.S. PATENT DOCUMENTS

| | | | |
|---|---|---|---|
| 7,521,090 B1 | 4/2009 | Cheng et al. | 427/256 |
| 2008/0217292 A1 | 9/2008 | Millward et al. | 216/2 |
| 2009/0035668 A1 | 2/2009 | Breyta et al. | 430/270.1 |
| 2010/0202017 A1 | 8/2010 | Sano | 358/1.15 |
| 2012/0088188 A1 | 4/2012 | Trefonas et al. | 430/203 |
| 2013/0243958 A1 | 9/2013 | Senzaki et al. | 524/556 |

(Continued)

FOREIGN PATENT DOCUMENTS

| | | |
|---|---|---|
| WO | WO/2013/119832 | 8/2013 |
| WO | WO/2014/035963 | 3/2014 |

OTHER PUBLICATIONS

Bates, C. M. et al. (2014) "Block Copolymer Lithography," *Macromolecules* 47(1), 2-12.

(Continued)

*Primary Examiner* — Amanda C Walke
(74) *Attorney, Agent, or Firm* — Medlen & Carroll, LLP

(57) ABSTRACT

A method for ordering block copolymers including forming a first layer having a first preference mode; and providing a reactive agent in selected regions of the first layer that modifies the selected regions to a second preference mode, wherein the selected regions define other regions of the first layer retaining the first preference mode thereby forming an alignment layer for block copolymers.

10 Claims, 17 Drawing Sheets

(56) References Cited

U.S. PATENT DOCUMENTS

| | | |
|---|---|---|
| 2013/0344242 A1 | 12/2013 | Willson et al. ............... 427/216 |
| 2014/0072722 A1 | 3/2014 | Kawanishi et al. ........... 427/510 |
| 2014/0238954 A1 | 8/2014 | Matsumiya et al. ....... 430/270.1 |
| 2015/0210793 A1 | 7/2015 | Park et al. ................... 524/553 |
| 2015/0287592 A1 | 10/2015 | Park et al. ................ 430/270.1 |
| 2015/0303055 A1 | 10/2015 | Xu et al. ....................... 438/636 |
| 2016/0122571 A1 | 5/2016 | Cheng et al. ................. 524/548 |

OTHER PUBLICATIONS

Bates, C. M. et al. (2012) "Polarity-Switching Top Coats Enable Orientation of Sub-10-nm Block Copolymer Domains," *Science* 338(6108), 775-779.

Bates, F. S. et al. (1990) "Block copolymer thermodynamics: theory and experiment," *Annual Review of Physical Chemistry 41*, 525-557.

Bates, F. S. et al. (1999) "Block Copolymers—Designer Soft Materials," *Physics Today 52*(2), 32-38.

Cheng, J. Y. et al. (2008) "Dense Self-Assembly on Sparse Chemical Patterns: Rectifying and Multiplying Lithographic Patterns Using Block Copolymers," *Advanced Materials 20*(16), 3155-3158.

Cheng, J. Y. et al. (2002) "Fabrication of nanostructures with long-range order using block copolymer lithography," *Applied Physics Letters 81*(19), 3657.

Cheng, J. Y. et al. (2010) "Simple and Versatile Methods to Integrate Directed Self-Assembly with Optical Lithography Using a Polarity-Switched Photoresist," *ACS Nano 4*(8), 4815-4823.

Cheng, J. et al. (2011) Developing directly photodefinable substrate guiding layers for block copolymer directed self-assembly (DSA) patterning, pp. 79722I-79722I-79713.

Delgadillo, P. A. R. et al. (2012) "Implementation of a chemo-epitaxy flow for directed self-assembly on 300-mm wafer processing equipment," *Journal of Micro/Nanolithography, MEMS, and MOEMS 11*(3), 031302-031301-031302-031305.

Delgadillo, P. R. et al. (2013) "Defect source analysis of directed self-assembly process," *Journal of Micro/Nanolithography, MEMS, and MOEMS 12*(3), 031112-031112.

Gronheid, R. et al. (2012) "Frequency multiplication of lamellar phase block copolymers with grapho-epitaxy directed self-assembly sensitivity to prepattern," *Journal of Micro/Nanolithography, MEMS, and MOEMS 11*(3), 031303-031301-031303-031306.

Han, E. et al. (2010) "Resist Free Patterning of Nonpreferential Buffer Layers for Block Copolymer Lithography," *ACS Nano 4*(11), 6527-6534.

Liu, C.-C. et al. (2010) "Integration of block copolymer directed assembly with 193 immersion lithography," *Journal of Vacuum Science & Technology B 28*(6), C6B30-C36B34.

Liu, C.-C. et al. (2011) "Towards an all-track 300 mm process for directed self-assembly," *Journal of Vacuum Science & Technology B 29*, 06F203.

Maher, M. J. et al. (2014) "Interfacial Design for Block Copolymer Thin Films," *Chemistry of Materials 26*(3), 1471-1479.

Ouk Kim, S. et al. (2003) "Epitaxial self-assembly of block copolymers on lithographically defined nanopatterned substrates," *Nature 424*(6947), 411-414.

Park, M. et al. (1997) "Block Copolymer Lithography: Periodic Arrays of ~1011 Holes in 1 Square Centimeter," *Science 276*(5317), 1401-1404.

Peters, R. D. et al. (2000) "Using Self-Assembled Monolayers Exposed to X-rays to Control the Wetting Behavior of Thin Films of Diblock Copolymers," *Langmuir 16*(10), 4625-4631.

Ramírez-Hernandez, A. et al. (2014) "Control of Directed Self-Assembly in Block Polymers by Polymeric Topcoats," *Macromolecules 47*, 3520-3527.

Rockford, L. et al. (1999) "Polymers on Nanoperiodic, Heterogeneous Surfaces," *Physical Review Letters 82*, 2602-2605.

Ruiz, R. et al. (2008) "Density multiplication and improved lithography by directed block copolymer assembly," *Science 321*(5891), 936-939.

Segalman, R. A. et al. (2001) "Graphoepitaxy of Spherical Domain Block Copolymer Films," *Advanced Materials 13*(15), 1152-1155.

Seshimo, T. et al. (2012) "Block copolymer orientation control using a top-coat surface treatment," *Journal of Photopolymer Science and Technology 25*(1), 123-130.

Stewart, M. D. et al. (2000) "Study of acid transport using IR spectroscopy and SEM," *Proceedings of SPIE—The International Society for Optical Engineering 3999*, 665-674.

Stewart, M. D. et al. (2002) "Acid catalyst mobility in resist resins," *Journal of Vacuum Science & Technology B 20*(6), 2946-2952.

Stoykovich, M. P. et al. (2005) "Directed Assembly of Block Copolymer Blends into Nonregular Device-Oriented Structures," *Science 308*(5727), 1442-1446.

Yang, X. M. et al. (2000) "Guided Self-Assembly of Symmetric Diblock Copolymer Films on Chemically Nanopatterned Substrates," *Macromolecules 33*(26), 9575-9582.

Yoshida, H. et al. (2013) "Topcoat Approaches for Directed Self-Assembly of Strongly Segregating Block Copolymer Thin Films," *Journal of Photopolymer Science and Technology 26*(1), 55-58.

FIG. 3A
FIG. 3B
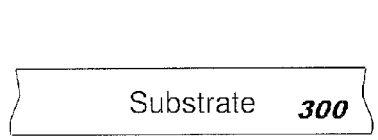
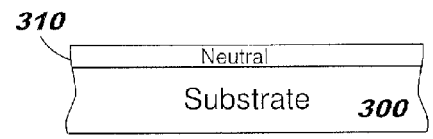
FIG. 3C
FIG. 3D
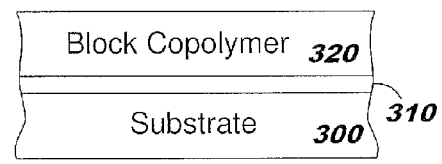
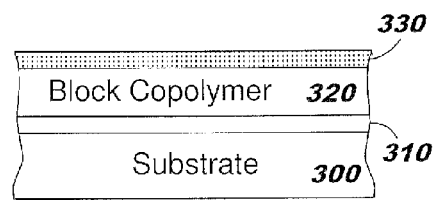
FIG. 3E
FIG. 3F
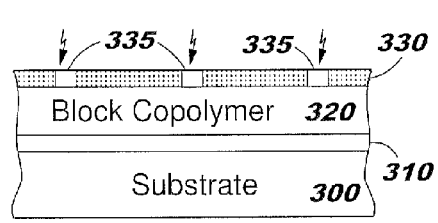
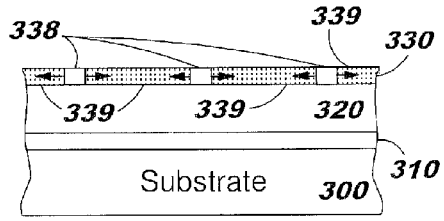
FIG. 3G
FIG. 3H
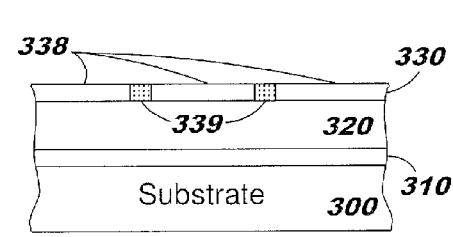
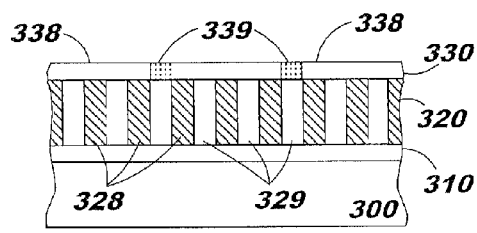

FIG. 4A
FIG. 4B
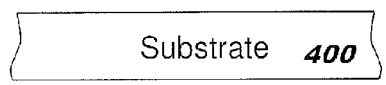
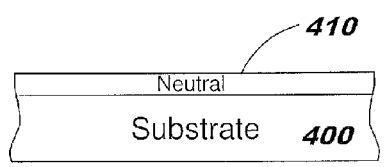
FIG. 4C
FIG. 4D
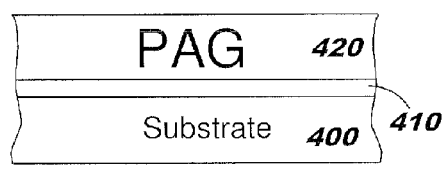
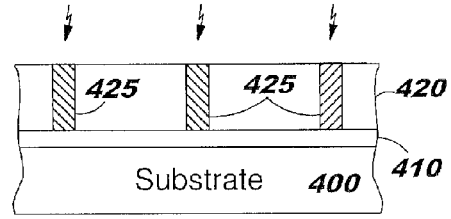
FIG. 4E
FIG. 4F
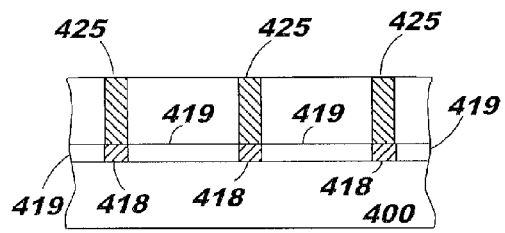
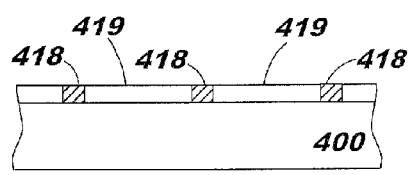
FIG. 4G
FIG. 4H
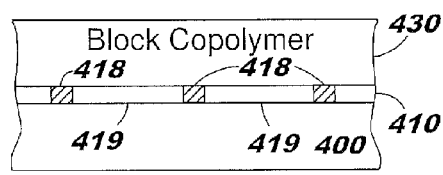
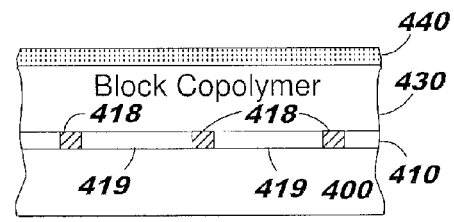

Preferential        Neutral        Preferential
Strongly Polar                     Strongly Non-Polar

ORDERING BLOCK COPOLYMERS

FIELD OF THE INVENTION

The present invention relates generally to aligning and orienting block copolymers, and in particular, to a method for aligning block copolymers in manufacturing processes. In particular, the alignment method utilizes incident irradiation to generate a photo-pattern on a block copolymer top coat.

BACKGROUND

Block copolymers are macromolecules that include at least two sequences of chemically distinct repeat units. These materials are well known in material science. In a non-limiting example, two homopolymers consisting of repeat units A and B, respectively, are connected by a covalent bond as a diblock copolymer, commonly referred to as an AB diblock copolymer. The average number of repeat units of A and B in a given block copolymer chain can vary, and the average number of A and B repeat units relative to one another may also be varied. In some circumstances, block copolymers may include blocks that contain more than one monomer or have ill-defined or irregular repeat units. Block copolymers can also include triblock copolymers, such as ABA triblock copolymers, and other types of multiblock copolymers that are well known in the art.

Often the two blocks (e.g., including units A and B) may be repulsive or at least more attracted to other blocks of the same kind than to each other, and as a result they may not easily mix with each other. Block incompatibility results in phase separation, the nature of which is dependent on several factors, including the chemical nature of the blocks, the temperature, etc. Because the blocks are covalently attached, phase separation can occur on the nanoscale, resulting in formation of periodic domains of the chemically distinct blocks. The characteristic periodicity of the domain separation is referred to herein as L0. L0 is a term known by those of ordinary skill in the art.

In certain conditions, the block copolymers can undergo phase separation to form periodic nanostructures such as lamellae, cylinders, spheres, etc. as is well known in the art. In thin film applications of block copolymers, the orientation of the block copolymer domains is important. In non-limiting examples, lamellae forming block copolymers in thin films can have their domains oriented parallel or perpendicular to the plane of the substrate upon which they are coated. The orientation of block copolymer domains in thin films is controlled by the chemical nature of the interfaces between the block copolymer domains and the top and bottom surfaces that define the film. For example, if the underlying substrate surface preferentially wets block A, lamellar domains are formed parallel to the plane of the substrate. This creates a stack of parallel domains where block A is in contact with the substrate. In a second example, the underlying substrate may be neutral and does not preferentially wet either block. As a result, the block copolymers can form domains of lamellae, cylinders, etc. perpendicular to the plane of the substrate. Thus, the domains of a lamellar forming block copolymer are oriented perpendicular to the substrate but with no long-range alignment order. In a third example, the underlying substrate may be neutral with defined regions preferential to block A that are about half the length of a periodicity (0.5 L0). Each of these preferential regions attracts the A block of the block copolymer, thereby "pinning" the A domain to that desired area and thereby enabling aligned and oriented vertical domains of blocks. This is known in the art as directed self-assembly. A preferential region about one and a half times the pattern length (1.5 L0) can also be used for pinning a particular domain.

After self-assembly, selective removal of one of the blocks can yield three-dimensional nanoscale relief structures. Selective removal of one block can be achieved via wet or dry etching. For example, blocks A and B etch at different rates under certain reactive ion etch conditions, which allow one block to be selectively removed (referred to herein as etch selective or etch dissipative) and the other to yield structures (referred to herein as etch resistant or etch formative). The etching of such block copolymers that are oriented and aligned as described above can result in a periodic series of deposited lines, pillars, or other structures which may be useful in certain semiconductor or other nanostructure applications.

SUMMARY OF THE INVENTION

The present invention relates generally to aligning and orienting block copolymers, and in particular, to a method for ordering block copolymers in manufacturing processes. In particular, the alignment method utilizes incident irradiation to generate a photo-pattern on a block copolymer top coat.

In one embodiment, the present invention contemplates a method for aligning and orienting block copolymers by patternwise photoexposure of reactive layers to form alignment layers having areas that are preferably wet by one block of a block copolymer (BCP) and other areas that are either preferably wet by other blocks or not preferably wet by one or more of the blocks (i.e., neutral), comprising: exposing a reactive layer to irradiation under conditions such that the reactive layer undergoes a photopatterned reaction that produces a change in local surface energy or surface tension or wettability preference for any block of the block copolymer. It is not intended that the present invention be limited to the number or positioning of the reactive layers. In one embodiment the reactive layer is below the BCP. In another embodiment, the reactive layer is grafted or covalently bound to a substrate. In one embodiment, the reactive layer is above the BCP. In a preferred embodiment, there are reactive layers both above and below the BCP.

It is not intended that the present invention be limited to any particular reactive agent. In one embodiment, the reactive layer contains chemical functionalities that react with photogenerated species such as acid, base, radicals, etc. to produce a patterned change in surface energy or surface tension of the reactive layer, thus changing block copolymer wetting characteristics. In one embodiment, the reactive layer contains intrinsic reactive functionalities that undergo photoreactions to produce a patterned change in surface energy or surface tension of the reactive layer, thus changing block copolymer wetting characteristics. In one embodiment, the acid is generated by photoacid generator or base is generated by photobase generator or radicals are generated by photoradical generator. In one embodiment, the photo-products that react with the reactive layer are generated in a layer adjacent to the reactive layer. In one embodiment, the photo-products migrate into the reactive layer to induce the patterned reaction in the reactive layer. In one embodiment, the photo-products that react with the reactive layer are generated in the block copolymer. In one embodiment, the reactive layer is a polymer containing photoreactive groups or polymer doped with photoreactive molecules or any other polymeric or non-polymeric photoreactive substance. In one embodiment, the reactive reagent diffuses in the reactive layer such that the chemically modified area with different surface energy or surface tension or wettability characteristics is smaller or larger than the area of the primary exposure.

In one embodiment, the present invention contemplates a method of aligning and orienting block copolymers comprising: a) providing a block copolymer comprising repeat units of block A and block B, a substrate, and materials for forming layers; b) forming a first layer on said substrate that either preferentially wets block A of said block copolymer, or is neutral and does not preferentially wet either block of said block copolymer, said first layer comprising a reactive agent carriers; c) forming a block copolymer layer on top of and adjoining said first layer; d) before or after step c), selectively irradiating said reactive agent carriers of said first layer in a pattern whereby the irradiated reactive agent carriers provide the reactive agent into the selected regions of the first layer so as to modify the preferential wetting of said selected regions; e) application of a topcoat on top of the block copolymer layer so as to create an assembly; and f) treating said assembly so as to orient and align the block copolymer.

It is not intended that the present invention be limited by the preference of the topcoat. In one embodiment, said topcoat does not preferentially wet either block of said block copolymer. In another embodiment, it preferentially wets either block.

It is not intended that the present invention be limited to the nature of the treating. In one embodiment, said treating of step f) comprises thermal annealing.

In one embodiment, the method further comprises treating said first layer such that the reactive agents are diffused, thereby enlarging in size of the selected regions of the first layer and reducing in size the other regions of the first layer. As described herein, there are a number of ways to cause such diffusion.

It is not intended that the present invention be limited to only layers which contain the reactive agent carriers when formed. In one embodiment, said reactive agent carriers are introduced into said first layer after it is formed in step b). For example, the reactive agent carriers might be in an adjoining layer that is treated so as to cause the reactive agent carriers to be introduced into said first layer.

It is not intended that the present invention be limited by the nature of the reactive agent carriers or the reactive agents. In one embodiment, the reactive agent carriers are photoacid generators. In one embodiment, the reactive agent is acid. In one embodiment, the reactive agent is base.

In another embodiment, the present invention contemplates a method of aligning and orienting block copolymers comprising: a) providing a block copolymer comprising repeat units of block A and block B, a substrate, and materials for forming layers; b) forming a first layer on said substrate that does not preferentially wet either block of said block copolymer; c) forming a block copolymer layer on top of and adjoining said first layer; d) forming a topcoat layer on top of said block copolymer layer that either preferentially wets block A of said block copolymer, or is neutral and does not preferentially wet either block of said block copolymer, so as to create an assembly, said topcoat layer comprising a reactive agent carriers; e) selectively irradiating said reactive agent carriers of said topcoat layer in a pattern whereby the irradiated reactive agent carriers provide the reactive agent into the selected regions of the first layer so as to modify the preferential wetting of said selected regions; and f) treating said assembly so as to orient and align the block copolymer.

Again, it is not intended that the present invention be limited to the nature of the treating. In one embodiment, said treating of step f) comprises thermal annealing.

In one embodiment, the method further comprises treating said topcoat layer such that the reactive agents are diffused, thereby enlarging in size of the selected regions of the topcoat layer and reducing in size the other regions of the topcoat layer. As described herein, there are a number of ways to cause such diffusion.

Again, it is not intended that the present invention be limited to only layers which contain the reactive agent carriers when formed. In one embodiment, said reactive agent carriers are introduced into said topcoat layer after it is formed in step d). For example, the reactive agent carriers might be in an adjoining layer that is treated so as to cause the reactive agent carriers to be introduced into said topcoat layer.

It is not intended that the present invention be limited by the nature of the reactive agent carriers or the reactive agents. In one embodiment, the reactive agent carriers are photoacid generators. In one embodiment, the reactive agent is acid. In one embodiment, the reactive agent is base.

The present invention contemplates yet another embodiment of a method of aligning and orienting block copolymers comprising: a) providing a block copolymer comprising repeat units of block A and block B, a substrate, and materials for forming layers; b) forming a first layer on said substrate that either preferentially wets block A of said block copolymer, or is neutral and does not preferentially wet either block of said block copolymer, said first layer comprising a reactive agent carriers; c) forming a block copolymer layer on top of and adjoining said first layer; d) forming a topcoat layer on top of said block copolymer layer that either preferentially wets block A of said block copolymer, or is neutral and does not preferentially wet either block of said block copolymer, so as to create an assembly, said topcoat layer comprising a reactive agent carriers; e) selectively irradiating said reactive agent carriers of said first and topcoat layers in a pattern whereby the irradiated reactive agent carriers provide the reactive agent into the selected regions of the first layer and topcoat layer so as to modify the preferential wetting of said selected regions; and f) treating said assembly so as to orient and align the block copolymer.

Again, it is not intended that the present invention be limited to the nature of the treating. In one embodiment, said treating of step f) comprises thermal annealing. Again, it is not intended that the present invention be limited by the nature of the reactive agent carriers or the reactive agents. In one embodiment, the reactive agent carriers are photoacid generators. In one embodiment, the reactive agent is acid. In one embodiment, the reactive agent is base.

Again, it is not intended that the present invention be limited to only layers which contain the reactive agent carriers when formed. In one embodiment, the reactive agent carriers are introduced into said topcoat layer after it is formed in step d). In one embodiment, the reactive agent carriers are introduced into said first layer after it is formed in step b).

In one embodiment, the present invention contemplates a method of ordering block copolymers comprising: forming a first layer having a first preference mode; and providing a reactive agent in selected regions of the first layer that modifies the selected regions to a second preference mode, wherein the selected regions define other regions of the first layer retaining the first preference mode thereby forming an alignment layer for block copolymers. In one embodiment, the method further comprises: forming a block copolymer layer to adjoin the first layer; and annealing the block copolymer layer and the adjoining first layer to induce ordering of portions of the block copolymer layer into first and second domains in accordance with the preference modes of the selected and other portions of the adjoining first layer. In one embodiment, the method further comprises selectively irradiating sets of reactive agent carriers in a pattern whereby each set of reactive agent carriers corresponds to a selected region of the first layer; wherein the irradiated reactive agent carriers provide the reactive agent into the selected regions of the first layer. In one embodiment, the reactive agents are diffused, thereby enlarging in size the selected regions of the first layer and reducing in size the other regions of the first layer. In one embodiment, the other regions of the first layer having a first preference mode are reduced in size during diffusion to a width less than a linewidth of the irradiation pattern. In one embodiment, the first layer is formed prior to the block copolymer layer being formed. In one embodiment, the block copolymer layer is formed after the first layer. In one embodiment, the method further comprises forming a second layer adjoining the block copolymer layer after the block copolymer layer is formed. In one embodiment, the selectively irradiating sets of reactive agent carriers in a pattern for providing the reactive agent into selected regions of the first and second layers. In one embodiment, the annealing is performed with thermal annealing. In one embodiment, the annealing is performed with solvent annealing. In one embodiment, the method further comprises etching the block copolymer layer. In one embodiment, the etching of the block copolymer layer removes the first domain and forms structures in the second domain. In one embodiment, the method further comprises forming a radiation sensitive layer containing reactive agent carriers adjoining the first layer; wherein the radiation sensitive layer is removed after providing the reactive agent into the first layer. In one embodiment, the selected portions of the first layer are not irradiated and not exposed to the reactive agent, thereby retaining a first preference mode. In one embodiment, the portions of the block copolymer layer corresponding to the selected portions of the first layer are oriented and not aligned during annealing.

In one embodiment, the present invention contemplates a method for ordering block copolymers comprising: forming a first layer having a first preference mode; providing a reactive agent in selected regions of the first layer that modifies the selected regions to a second preference mode, wherein the selected regions define other regions of the first layer retaining the first preference mode thereby forming an alignment layer for block copolymers; forming a block copolymer layer above the alignment layer; and annealing the block copolymer layer and the alignment layer to induce ordering of portions of the block copolymer layer into first and second domains in accordance with the preference modes of the alignment layer. In one embodiment, the method further comprises forming a second layer having a third preference mode above the block copolymer layer. In one embodiment, the method further comprises providing a second reactive agent into selected regions of the second layer to modify those selected regions of the second layer to a fourth preference mode, wherein the selected regions define other regions of the second alignment layer retaining the second preference mode. In one embodiment, the first preference mode is equivalent to the third preference mode and wherein the second preference mode is equivalent to the fourth preference mode. In one embodiment, annealing the block copolymer layer and the first alignment layer includes concurrently annealing the second alignment layer to induce ordering of portions of the block copolymer layer into first and second domains in accordance with the preference modes of the selected and other portions of the first and second alignment layers. In one embodiment, the reactive agent is an acid released from photoacid generators that have been irradiated. In one embodiment, the photoacid generators for both the first and second alignment layers are irradiated concurrently.

In one embodiment, the present invention contemplates, a method for ordering block copolymers comprising: forming a reactive layer having a first preference mode to adjoin a block copolymer layer; irradiating selected regions of the reactive layer to convert the selected portions to a second preference mode, wherein the selected regions define other regions of the reactive layer having the first preference mode; and ordering the block copolymer layer utilizing the selected regions with the second preference mode and the other regions with the first preference mode. In one embodiment, the reactive layer is formed prior to the block copolymer layer. In one embodiment, the reactive layer is formed after the block copolymer layer. In one embodiment, the reactive agent generators are irradiated in the selected regions of the reactive layer for converting the selected regions to the second preference mode. In one embodiment, the method further comprises forming a reactive agent generator containing layer adjoining the reactive layer; wherein selected reactive agent generators are irradiated to release a reactive agent for diffusion into the selected regions of the reactive layer.

In one embodiment, the present invention contemplates a method comprising: a) providing; i) a block copolymer comprising first and second blocks, ii) materials for making reactive layers, and iii) a substrate; b) depositing materials on said substrate so as to create a first reactive layer, c) depositing said block copolymer on said substrate to create a block copolymer layer on top of said first reactive layer; d) depositing materials on said block copolymer layer so as to create a second reactive layer on top of said block copolymer layer (e.g. so as to create a top coat); e) irradiating said reactive layers thereby creating a photo-pattern and f) treating said block co-polymer layer so as to align at least one of said first and second blocks. In one embodiment, the aligned block of the copolymer layer is perpendicular to the substrate. In one embodiment, the aligned block of the copolymer layer is parallel. In one embodiment, the method further comprises annealing said photo-pattern top coat to said substrate. In one embodiment, the method further comprises removing said photo-pattern top coat. In one embodiment, the method further comprises selective etching of said aligned block copolymer layer. In one embodiment, the irradiating comprises direct radiation. In one embodiment, the irradiating comprises indirect radiation combined with an additive formulation. In one embodiment, the additive formulation comprises a photoacid generator. In one embodiment, the irradiation catalyzes a realignment of said block copolymers. In one embodiment, the photo-pattern structures are controlled by elements selected from the group comprising top coat structure, additive structure, annealing time and irradiation exposure dose.

BRIEF DESCRIPTION OF THE DRAWINGS

The novel features believed characteristic of the invention are set forth in the appended claims. The invention itself, further objectives and advantages thereof, as well as a preferred mode of use, will best be understood by reference to the following detailed description of illustrative embodiments when read in conjunction with the accompanying drawings, wherein:

FIGS. 3A through 3J are cross sectional views of a structure during various steps used to orient and align block copolymers in accordance with a second embodiment;

DETAILED DESCRIPTION OF THE INVENTION

Figure 1A:
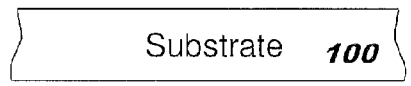
FIGS. 1A through 1M are cross sectional views of a structure during various steps used to orient and align block copolymers in accordance with a first embodiment.

The present invention relates generally to aligning and orienting block copolymers, and in particular, to a method for ordering block copolymers in manufacturing processes. In particular, the alignment method utilizes incident irradiation to generate a photo-pattern on a block copolymer top coat.

In one embodiment, the present invention contemplates a block copolymer top coat that is photo-patternable upon exposure to incident radiation. Although it is not necessary to understand the mechanism of an invention, it is believed that top coat thin films, as described herein, may undergo a reaction upon exposure to irradiation (i.e., for example, either direct irradiation or through formulation with an additive) that catalyzes a change in top coat structure. It is further believed that the magnitude of these changes and the dimension of the annealed exposed region relative to the exposed region as defined by the incident irradiation can be controlled by elements including, but not limited to, top coat structure, additive structure, annealing time and/or exposure dose.

In one embodiment, the present invention contemplates alignment (e.g., controlled directionality) of block copolymer features from the top-down, bottom-up or both. Current technology utilizes complicated processing to form directing patterns on the surface (i.e., the surface on which the block copolymer resides). There are a number of potential advantages to forming directing patterns from the top surface. First, there may be significantly fewer processing steps involved. Second, the directing top coat pattern can be removed after alignment of the block copolymer domains, which could simplify subsequent pattern transfer processes. Third, the size of the photo-reacted area can be controlled by element including, but not limited to, top coat structure, additive structure, annealing time, and/or exposure dose even with identical photo masks.

There are a number of advantages to forming directing photo-patterns on a top coat block copolymer surface. First, there may be significantly fewer steps involved. Second, the directing top coat pattern can be removed after alignment of the block copolymer domains, which could simplify subsequence pattern transfer processes. Third, the size of the photo-reacted area can be controlled by elements including, but not limited to, top coat structure, additive structure, annealing time, and/or exposure dose even with identical photo masks. Thus, the dimensions of the pre-pattern that block copolymers align to can be controlled by processing conditions.

The illustrative embodiments provide a method for ordering block copolymers including forming a first layer having a first preference mode; and providing a reactive agent in selected regions of the first layer that modifies the selected regions to a second preference mode, wherein the selected regions define other regions of the first layer retaining the first preference mode thereby forming an alignment layer for block copolymers.

Processes and structures may be implemented and utilized for aligning and orienting block copolymers. These processes and structures may be implemented and utilized as will be explained with reference to the various embodiments below.

In these embodiments, an alignment layer is formed adjoining a block copolymer layer for inducing the ordered formation of block domains within the adjoining copolymer layer. A block copolymer layer may be a diblock copolymer, a triblock copolymer, or a multiblock copolymer depending on the application. The adjoining alignment layer may be below the block copolymer layer and above the substrate, above the block copolymer layer and above the substrate, or a combination of both. The adjoining alignment layer may be formed before the block copolymer layer or after the copolymer layer.

The alignment layer may be referred to herein as a reactive layer prior to that layer being converted, modified or otherwise transformed (formed) by a reactive agent into an alignment layer. An alignment layer that has been converted, modified, or otherwise transformed (formed) may also be referred to as a guiding layer. The reactive agent, such as an acid or base, can be selectively provided such as by diffusion in specific regions of the reactive layer for modifying a preference mode of the alignment layer at those specific regions. A preference mode may be preferential to a first block of the block copolymer, a second block of the copolymer, or neutral (or near neutral) to both the first and second block. An alignment layer may have been initially formed as a reactive layer with the first preferential mode throughout the alignment layer, then selectively modified to the second referential mode through chemical reaction with the provided reactive agent. This selective diffusion results in forming the alignment layer having regions with the second preferential mode defining regions retaining the first preferential mode. This diffusion process may occur before or after the formation of the block copolymer layer. The reactive agent may be located in the alignment layer, the block copolymer layer, or in another layer adjoining the alignment layer.

Once the alignment layer has been selectively modified with the provided reactive agent (i.e., such as by diffusion) into first and second regions with first and second preferential modes, the block copolymer is ordered (oriented and aligned) into block domains by annealing. This process allows the block copolymer molecules to form ordered block copolymer domains in accordance with the preference modes of the adjoining alignment layer or layers. This ordering of domains includes the alignment and orientation of those domains. The block copolymer may then be etched whereby any etch resistant blocks of the copolymer may form structures in accordance with the ordering of the block copolymer. There are many such structure formations possible and methods of forming those structures as described with reference to the embodiments below.

FIGS. 1A through 1M are cross sectional views of a structure during various steps used to orient and align (order) block copolymers in accordance with a first embodiment. In this embodiment, an alignment layer is formed below the block copolymer. The alignment layer has carefully patterned regions that are neutral and regions that preferentially interact with one of the blocks of the block copolymer.

FIG. 1A illustrates a substrate 100 from which the process starts. Substrate 100 may be a bare silicon wafer, a semiconductor device with underlying circuitry which needs a mask (i.e., structures generated by the below described processes) for further processing, a disk drive platter which needs patterning, etc. The substrate or top layer of the substrate may be monolithic and composed of silicon, quartz, metal, glass, or other types of materials depending on the application. It is on this substrate that block copolymers may be deposited, aligned and oriented for use in patterning the underlying substrate or for building structures above the substrate. For illustrative purposes, the substrate will be silicon in this embodiment. This silicon substrate may be amorphous or crystallized depending on the application. Typically such a silicon surface will have a native oxide on the surface including pervasive silanols. Alternative embodiments can be used to handle other types of substrates.

Figure 1B:
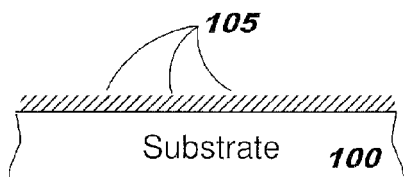
Figure 1C:
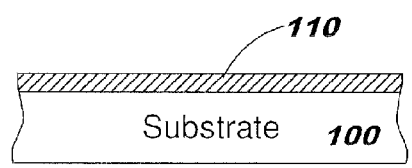

FIGS. 1B and 1C illustrate the creation of a surface layer 110 formed on the substrate. This layer can serve multiple purposes. It provides a surface for the application of subsequent materials such as by spin coating or deposition. In addition, with subsequent processing such as described below, it can be utilized to form an alignment layer, one that can be used to align subsequently deposited block copolymers. In this embodiment, this surface layer is chemically grafted to the substrate (e.g., covalently bonded), although in alternative embodiments this surface layer can be physically adhered to the substrate and crosslinked or be a combination of grafted and crosslinked material. Methods for grafting such layers to the substrate are known in the art and the art teaches how to create such layers by crosslinking.

FIG. 1B illustrates the addition of a binding material to the substrate. In this embodiment, APTES (aminopropyltriethoxysilane) can be applied to the substrate surface to react with the substrate surface silanols, thereby leaving amines 105 such as $NH_2$ bonded to the surface of the substrate. These amines allow other subsequently provided materials to bind to the surface of the substrate. In this embodiment, APTES is applied to the silicon substrate for about 30 seconds at room temperature, although alternative times, temperatures, and deposition processes may be utilized. The surface may then be rinsed with an organic solvent and may be post-baked to remove any excess APTES or solvent. Alternative embodiments may utilize different binding materials or no binding materials depending on the properties of the substrate and the subsequently applied materials. For example, a layer may be deposited and then crosslinked to render it insoluble and adherent to the substrate. In the present invention, the neutral or preferential interaction characteristics of the layer can be modified by patternwise exposure to radiation followed in some cases by baking.

FIG. 1C illustrates the addition of a desired surface reactive layer of this sort 110 to the binding material. As described above, with further processing this surface reactive layer will later be utilized to form an alignment layer that will interact with the subsequently deposited block copolymers. In this embodiment, the surface layer is a material that is initially preferential to one of the blocks (e.g., a silicon bearing or etch resistant block), although alternative embodiments may utilize a neutral material that is not preferential to either block. This is referred to herein as a preferential mode, which may be preferential to a first block of a copolymer, a second block of the copolymer, or neutral (or near neutral) to either block. This initially preferential material can be spin coated or otherwise deposited to the surface for bonding with the underlying reactive layer. This spin coating process may followed by baking for about two minutes at 180 degrees Celsius, rinsing with a solvent, then baking again to remove the solvent, thereby providing a thin, reactive layer approximately 3 to 5 nanometers in thickness. Alternative layer thicknesses may be provided based on a variety of factors such as the type of deposition, length of time for spin coating, the temperature of the spin coating, the type of deposited layer, the desired thickness of the surface layer, and other factors known to those of ordinary skill in the art.

Figure 1D:
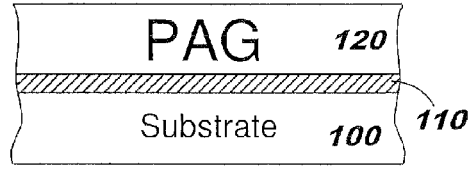

FIG. 1D illustrates the addition of a PAG (photoacid generator) carrier layer 120. This is a temporary polymer layer in this embodiment that serves as a carrier matrix for photoacid generators such as triphenylsulfonium triflate. Upon exposure to radiation such as light or electron beams with a given linewidth (e.g., using 193 nm wavelength irradiation to generate 43 nm linewidth features), the photoacid generators may be converted to acid. Those photoacid generators not exposed to light are not converted to acid. By patternwise exposure or other type of irradiation, selected areas of PAG can be converted to acid for use as described below. Depending on conditions, acid can be released by the photoacid generators to surrounding materials or retained. In this embodiment, the PAG layer may be approximately 40 nm thick, although alternative thicknesses may be utilized. Alternative embodiments may utilize alternative reactive agents such as a base to change the preferential mode of a surface layer. Alternative embodiments may also utilize other types of reactive agent carriers to provide the reactive agent upon being irradiated. Further alternative embodiments may include the reactive agent carriers in the reactive surface layer or in other adjoining layers including the block copolymer layer.

Figure 1E:
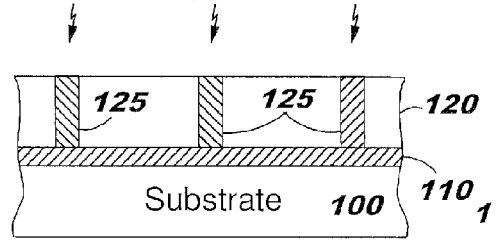

FIG. 1E illustrates the selective exposure of the PAG layer to radiation for converting the PAGs to acid in selected regions 125 of the PAG layer 120. This may be performed using standard photolithography techniques such as using a photomask in a photolithography exposure tool or by using other techniques such as electron beam exposure, direct write techniques, etc. Regardless of the technique utilized, selected acid regions 125 are generated as shown. The distance between these selected acid regions can be a multiple of the pattern length (L0) of the block copolymer for use as described below.

Figure 1F:
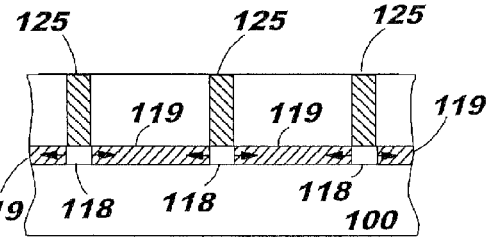
Figure 1G:
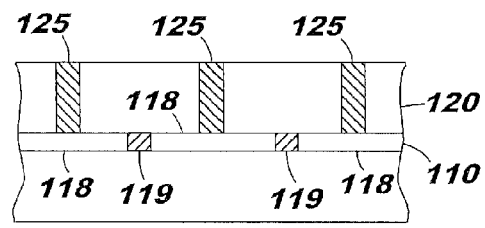

FIGS. 1F through 1G illustrate converting preferential areas of surface layer 110 to neutral regions 118. As shown in FIG. 1F, by using a post exposure bake process such that the area under the acid region 125 is exposed to acid through diffusion, thereby chemically modifying selected regions of the preferential layer to neutral and thereby creating, converting, transforming or otherwise forming an alignment layer from the reactive surface layer. As illustrated in FIG. 1G, by continuing the post exposure bake process, substantial portions of the preferential areas surrounding the neutral regions can converted to neutral. This can continue until the remaining preferential portions 119 of the alignment layer are narrowed to approximately one half of L0. This can be accomplished by the careful control of temperature and duration of the post-bake, the type of PAG relative to the surface layer, the density of photoacid generators, the composition of the PAG matrix, etc. Control of this process is described in greater detail below with reference to FIG. 2. One advantage of this approach is that the remaining preferential portions may be narrower than the selected regions 125. As a result, the remaining preferential regions and patterned block copolymers residuals generated as described below may be smaller than what is generated directly by the patterning processes.

Figure 1H:
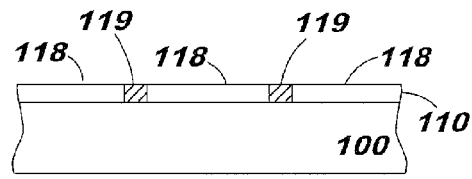
Figure 1I:
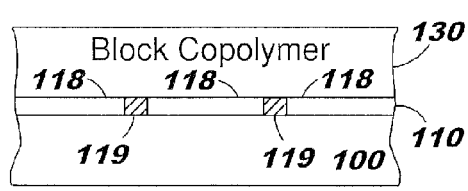

Once the post bake is completed and the desired neutral regions 118 and preferential regions 119 have been generated in the alignment layer, then the PAG layer can be removed as illustrated in FIG. 1H such as by a rinse with organic solvents. Then the block copolymer layer 130 may be spin coated onto the alignment layer as shown in FIG. 1I. At this point the block copolymers are typically not oriented or aligned. In this embodiment, the block copolymers chemically contain a silicon bearing block covalently bonded to a block not containing any silicon. Alternative embodiments may utilize other homopolymers or contain suspended materials or react with materials that respond selectively to etch or other removal techniques.

Figure 1J:
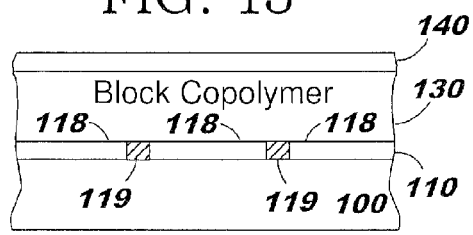

A top coat may then be spin coated onto the block copolymer layer as shown in FIG. 1J. The top coat in this embodiment is for protecting the block copolymers from being affected by exposure to the ambient during the next processing step. A top coat may not be needed for certain types of block copolymers. Alternative steps may be taken at this point as described below with reference to the second embodiment.

Figure 1K:
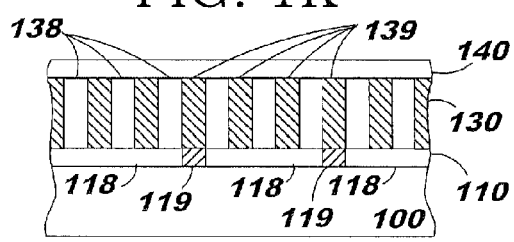

FIG. 1K illustrates the effect of annealing the current assembly of layers. This anneal may be a thermal anneal or a solvent anneal. This results in one block region or domain of the block copolymers being attracted to the preferential regions 119, thereby orienting, aligning and self-assembling or otherwise induce ordering of the block copolymers as shown. In this example, the preferential regions 119 attract or pin the silicon containing block region or domain 138 of the block copolymer. In alternative embodiments, the preferential region may attract the non-silicon bearing block region 139 of the block copolymer.

Figure 1L:
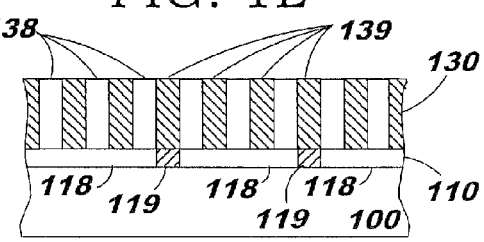
Figure 1M:
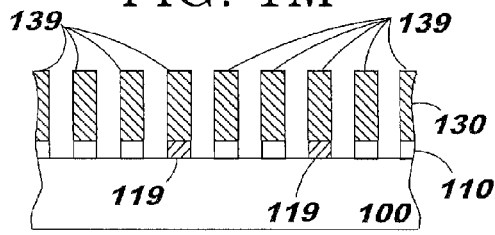

Now that the block copolymers are oriented and aligned through directed self-assembly, in some embodiments the top coat is stripped as illustrated in FIG. 1L. This can be performed by the use of a chemical bath selective to the top coat or by the use of chemical mechanical polishing or other removal techniques such as etching. One of the blocks of the block copolymer is then etched as illustrated in FIG. 1M resulting in the selective removal of one block (e.g., etch selective or non-silicon bearing block 138). Steps 1L and 1M may be performed in the same step by using a chemical bath or etch process which is effective in removing the top coat and the desired block of the block copolymer simultaneously. Such a process may extend into the alignment layer and the underlying substrate if desired.

A variety of steps can be taken at this point to utilize these patterned block copolymers structures. These will be explained in greater detail below.

Figure 2:
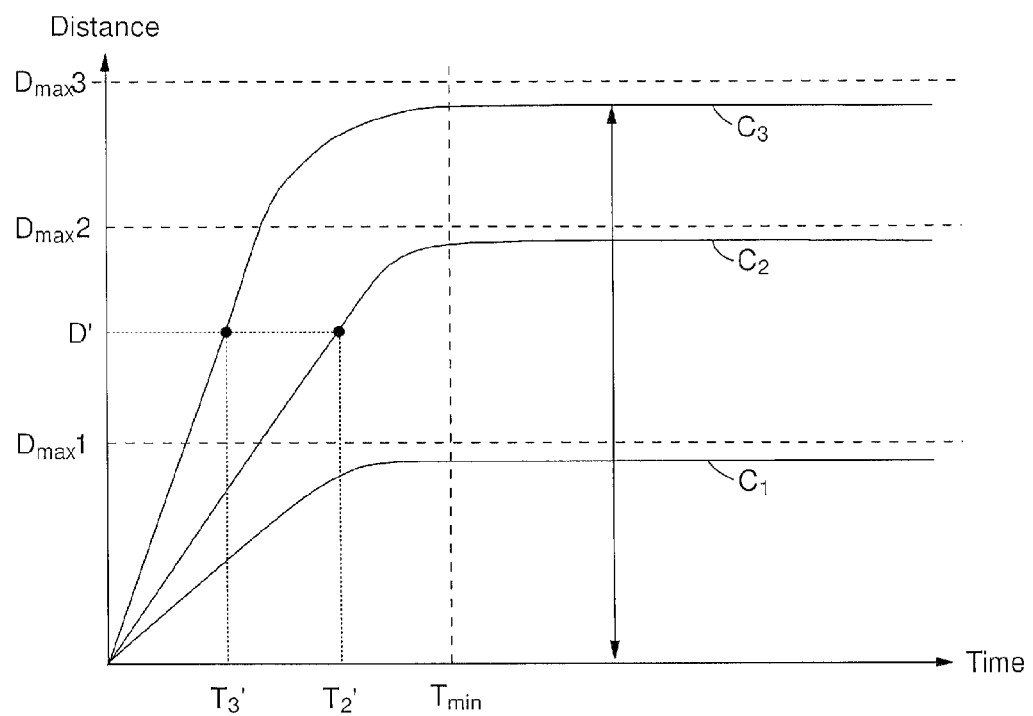
FIG. 2 is a timing diagram showing diffusing a reactive agent into a reactive layer in which various embodiments may be implemented.

FIG. 2 is a timing diagram showing diffusing a reactive agent into an alignment layer in which various embodiments may be implemented. Three diffusion curves C1, C2 and C3 are shown illustrating the distance that a reactive agent such as acid may travel into an alignment layer over time during the annealing process. These three curves may represent three different types of reactive agents or three different temperatures for the same reactive agent. The reactive agent may be diffusing from an exposed acid bearing region in a PAG layer as shown in the first embodiment or from exposed acid bearing regions within the alignment layer as shown in the second, third and fourth embodiments. Alternative embodiments may utilize other types of reactive agent carriers.

In this example, each curve has a different maximum diffusion extent, which starts with rapid diffusion and then slows towards an asymptotic limit or maximum Dmax. In order to limit variability, many manufacturers diffuse beyond a minimum time Tmin where the slope of the curve is very small or flat. The choice of a certain temperature, reactive agent, base quencher, etc. can then be used to determine a desired extent of diffusion. Many other factors as well as many other curves may be utilized depending on the application as known by those skilled in the art.

FIGS. 3A through 3J are cross sectional views of a structure during various steps used to orient and align block copolymers in accordance with a second embodiment. In this embodiment, an alignment layer is formed above rather than below the block copolymers.

FIG. 3A illustrates a substrate 300 from which the process starts. Substrate 300 may be a bare silicon wafer, a semiconductor device with underlying circuitry which needs a mask for further processing, a disk drive with media which needs patterning, etc. The substrate or top layer of the substrate may be monolithic and composed of silicon, quartz, metal, glass, or other types of materials depending on the application. It is on this substrate upon which block copolymers may be deposited, aligned and oriented for use in patterning the underlying substrate or for building structures above the substrate. For illustrative purposes, the substrate will be silicon in this embodiment. This silicon substrate may be amorphous or crystallized depending on the application. Typically such a silicon surface will have a native oxide on the surface including pervasive silanols. Alternative embodiments can be used to handle other types of substrates.

FIG. 3B illustrates the addition of a neutral or near neutral cross-linkable surface layer 310 adhered to the substrate. In this embodiment, the surface layer is not patternable or utilized as an alignment layer. It is, however, a neutral layer. This surface layer physically adheres to the surface of the substrate and is useful for providing a base for the block copolymers. This layer may not be needed in certain situations.

Then the block copolymer layer 320 is spin coated onto the surface layer as shown in FIG. 3C. At this point the block copolymers are typically not oriented or aligned. In this embodiment, the block copolymers chemically contain a silicon bearing block covalently bonded to a block not containing any silicon. Alternative embodiments may utilize other homopolymers or suspended materials that respond selectively to etch or other removal or baking techniques.

A reactive top coat layer 330 containing photoacid generators (PAGs) is then spin coated over the block copolymers and baked as shown in FIG. 3D. Other methods may be utilized for forming the top coat. With further processing as described below, this top coat may be utilized to align subsequently the underlying block copolymers. In this embodiment, the reactive top coat layer is preferential to one of the blocks (the non-silicon bearing or other type of etch selective block), although alternative embodiments may utilize a neutral material that is not preferential to either block. This is referred to herein as a preferential mode, which may be preferential to a first block of a copolymer, a second block of the copolymer, or neutral (or near neutral) to either block. In an alternative embodiment, reactive layer 330 may not contain photoacid generators and a subsequent PAG layer may be added as described above with reference to the first embodiment or the PAG may be contained in the block copolymer layer. Alternative embodiments may utilize alternative reactive agents such as a base to change the preferential mode of an alignment layer. Alternative embodiments may also utilize other types of reactive agent carriers.

FIG. 3E illustrates the selective exposure of the top coat layer to radiation with a given linewidth (e.g., using 193 nm wavelength irradiation to generate 43 nm linewidth features) for converting the PAGs to acid in selected regions 335 of layer 330. This may be performed using standard photolithography techniques such as using a photomask in a photolithography exposure tool or by using other techniques such as electron beam exposure, direct write techniques, etc. Regardless of the technique utilized, selected acid regions 335 are generated as shown. The distance between these selected acid bearing regions can be a multiple of a pattern length (L0) of the block copolymer for use as described below.

FIGS. 3F through 3G illustrate converting preferential areas of top coat layer 330 to neutral regions 338 thereby creating an alignment layer from the top coat. As shown in FIG. 3F, by using a post exposure bake process the areas within acid bearing regions 335 are exposed to acid through diffusion, thereby chemically modifying those regions of the preferential top coat layer to neutral regions 338. As illustrated in FIG. 3G, by continuing the post exposure bake process, substantial portions of the preferential areas 339 surrounding the neutral regions 338 can also be converted to neutral. This can continue until the remaining preferential portions 339 of the alignment layer are narrowed to approximately one half of L0 or a multiple of 0.5 times L0. This can be accomplished by the careful control of temperature and duration of the post-bake, the type of acid relative to the alignment layer composition, the density of photoacid generators, addition of base quenchers, etc. Control of this process is described in greater detail above with reference to FIG. 2. One advantage of this approach is that the remaining preferential portions may be narrower than the selected acid regions 335. As a result, the remaining preferential regions and patterned block copolymers regions generated as described below may be smaller than those generated directly by the patterning processes.

FIG. 3H illustrates the effect of annealing the current assembly of layers. This results in one block region or domain of the block copolymers being attracted to the preferential regions 339, thereby orienting, aligning and self-assembling or otherwise induce ordering of the block copolymers as shown. In this example, the preferential regions 339 attract or pin the non-silicon containing block region or domain 328 of the block copolymer. In alternative embodiments, the preferential region may attract the silicon bearing block region 329 of the block copolymer.

Figure 3I:
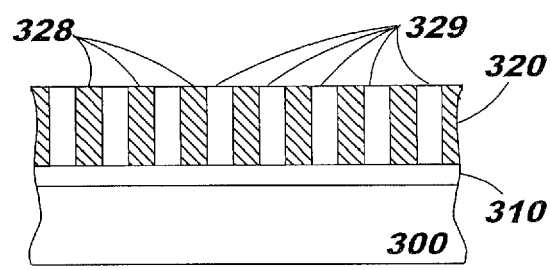
Figure 3J:
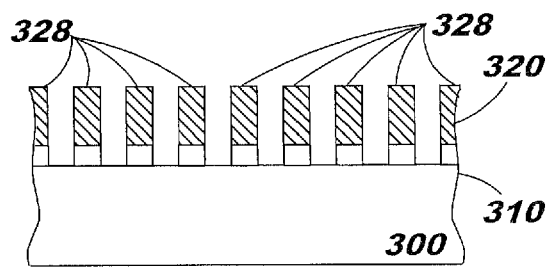

Now that the block copolymers are ordered (oriented and aligned through directed self-assembly), the alignment layer can be stripped as illustrated in FIG. 3I. This can be performed by the use of a chemical bath selective to the top coat or by the use of chemical mechanical polishing or other removal techniques such as etching. The block copolymers are then etched as illustrated in FIG. 3J resulting in the selective removal of domain (e.g., etch selective or non-silicon bearing block 328) of the block copolymer film. Steps 3I and 3J may be performed in the same step by using a chemical bath or etch process which is effective in removing the top coat and the desired block of the block copolymer simultaneously. Such a process may extend into the alignment layer and the underlying substrate if desired.

A variety of steps can be taken at this point to utilize these patterned block copolymers structures. These will be explained in greater detail below.

Figure 4I:
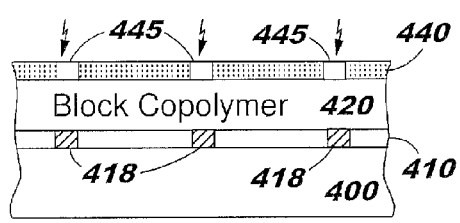
FIGS. 4A through 4N are cross sectional views of a structure during various steps used to orient and align block copolymers in accordance with a third embodiment.
Figure 4J:
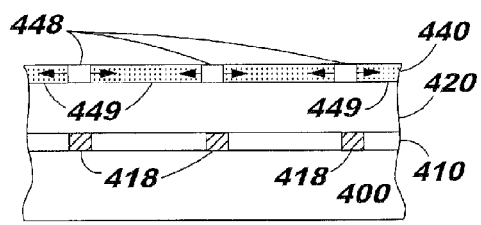
Figure 4K:
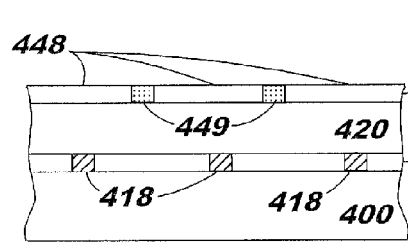
Figure 4L:
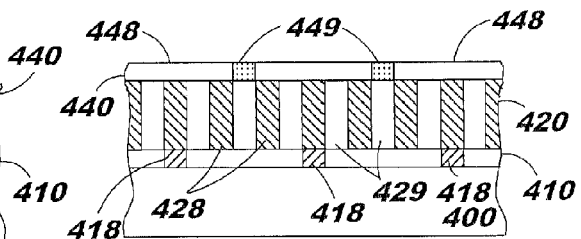
Figure 4M:
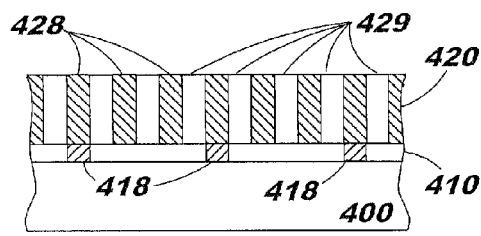
Figure 4N:
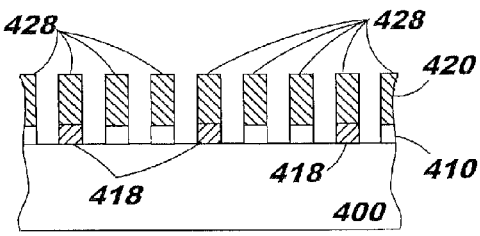

FIGS. 4A through 4N are cross sectional views of a structure during various steps used to orient and align block copolymers in accordance with a third embodiment. In this embodiment, alignment layers are formed both below and above the block copolymers.

FIG. 4A illustrates a substrate 400 from which the process starts. Substrate 400 may be a bare silicon wafer, a semiconductor device with underlying circuitry which needs a mask for further processing, disk drive media which needs patterning, etc. The substrate or top layer of the substrate may be monolithic and composed of silicon, quartz, metal, glass, or other types of materials depending on the application. It is on this substrate that block copolymers may be deposited, aligned and oriented for use in patterning the underlying substrate or for building structures above the substrate. For illustrative purposes, the substrate will be silicon in this embodiment. This silicon substrate may be amorphous or crystallized depending on the application. Typically such a silicon surface will have a native oxide on the surface including pervasive silanols. Alternative embodiments can be used to handle other types of substrates.

FIG. 4B illustrates the creation of a surface alignment layer 410 formed on the substrate. This layer can serve multiple purposes. It provides a surface for the application of subsequent materials such as by spin coating or deposition. In addition, with subsequent processing such as described below, it can be utilized in aligning subsequently deposited block copolymers as an alignment layer. In this embodiment, this surface layer is physically adhered to the substrate as cross linkable layer. In an alternative embodiment, this surface layer may be chemically grafted to the substrate (e.g., covalently bonded), or a combination of grafting and cross-linking.

In this embodiment, layer 410 is a neutral material that is not preferential to either block, although alternative embodiments may utilize a preferential material to one of the blocks. This neutral material can be spin coated or otherwise deposited to the surface for bonding with the underlying substrate. This spin coating process may be performed for about two minutes at 180 degrees Celsius, thereby providing a shallow alignment layer approximately 3 to 5 nanometers in thickness. Alternative layer thicknesses may be provided based on a variety of factors such as the type of deposition, length of time for spin coating, the temperature of the spin coating, the type of deposited layer, the desired depth of the layer, and other factors known to those of ordinary skill in the art.

FIG. 4C illustrates the addition of a PAG (photoacid generator) carrier layer 420. This is a temporary polymer layer in this embodiment with a matrix that includes photoacid generators such as triphenylsulfonium triflate. Upon exposure to radiation such as light with a given linewidth (e.g., using 193 nm wavelength irradiation to generate 43 nm linewidth features), the photoacid generators may be converted to acid. Those photoacid generators not exposed to light are not converted to acid. By selective patternwise exposure, selected areas of PAG can be converted to acid for use as described below. Depending on conditions, acid can be released by the photoacid generators to surrounding materials or retained. In this embodiment, the PAG layer may be approximately 40 nm in depth, although alternative depths may be utilized. Alternative embodiments may utilize alternative reactive agents such as a base to change the preferential mode of an alignment layer. Alternative embodiments may also utilize other types of reactive agent carriers.

FIG. 4D illustrates the selective exposure of the PAG layer to radiation for converting the PAGs to acid in selected regions 425 of the PAG layer 420. This may be performed using standard photolithography techniques such as using a photomask in a photolithography exposure tool or by using other techniques such as ebeam exposure, direct write techniques, etc. Regardless of the technique utilized, selected acid regions 425 are generated as shown. The distance between these selected acid regions can be a multiple of a pattern length (L0) of the block copolymer for use as described below.

FIG. 4E illustrates converting neutral areas of layer 410 to preferential regions 418. In this embodiment, the preferential regions 418 in layer 410 are preferential to the silicon bearing block of the block copolymer. As shown in FIG. 1F, by using a post exposure bake process the area under the acid region 425 is exposed to acid through diffusion, thereby chemically modifying regions of the neutral layer to become preferential.

Once the post bake is completed and the desired preferential regions 418 and neutral regions 419 are generated to produce the alignment layer, then the PAG layer can be removed as illustrated in FIG. 4F such as by a rinse with organic solvents. Then the block copolymer layer 430 may be spin coated onto the alignment layer as shown in FIG. 4G. At this point the block copolymers are typically not oriented or aligned, although some may occur due to the existence of preferential regions 418. In this embodiment, the block copolymers chemically contain a silicon bearing block covalently bonded to a block not containing any silicon. Alternative embodiments may utilize other homopolymers or contain suspended materials that respond selectively to etch or other removal or baking techniques.

A top layer 440 containing photoacid generators (PAGs) is then spin coated onto the block copolymers as shown in FIG. 4H. With further processing as described below, this layer will ultimately be utilized to assist in aligning the block copolymers in layer 420. In this embodiment, layer 440 is preferential to one of the blocks (e.g., an etch selective block such as a non-silicon bearing block), although alternative embodiments may utilize a neutral material that is not preferential to either block. In an alternative embodiment, layer 440 may not contain photoacid generators and a subsequent PAG layer may be added as described above with reference to the first embodiment. Alternative embodiments may utilize alternative reactive agents such as a base to change the preferential mode of an alignment layer.

FIG. 4I illustrates the patternwise exposure of layer 440 to radiation for converting the PAGs to acid in selected regions 445 of layer 440. In this embodiment, the preferential regions in alignment layer 440 are preferential to the non-silicon bearing block of the block copolymer, unlike the preferential regions in alignment layer 410. This may be performed using standard photolithography techniques such as using a photomask in a photolithography exposure tool or by using other techniques such as ebeam exposure, direct write techniques, etc. Regardless of the technique utilized, selected acid regions 335 are generated as shown. The distance between these selected acid bearing regions can be a multiple of the characteristic periodicity (L0) of the block copolymer chains for use as described below.

FIGS. 4J through 4K illustrate converting preferential areas 449 of reactive to coat layer 440 to neutral regions 448. As shown in FIG. 4J, by using a post exposure bake process the areas within acid bearing regions 445 are exposed to acid through diffusion, thereby chemically modifying those regions of the preferential layer to neutral regions 448. As illustrated in FIG. 4K, by continuing the post exposure bake process, substantial portions of the preferential areas 449 surrounding the neutral regions 448 can also be converted to neutral. This can continue until the remaining preferential portions 449 of the layer are narrowed to approximately one half of L0 or a multiple of 0.5 L0. This can be accomplished by the careful control of temperature and duration of the post-bake, the type of acid relative to the alignment layer composition, the density of photoacid generators, added base quenchers, etc. Control of this process is described in greater detail above with reference to FIG. 2. One advantage of this approach is that the remaining preferential portions may be narrower than the selected acid regions 445. As a result, the remaining preferential regions generated as described may be smaller than generated directly by the patterning processes.

FIG. 4L illustrates the effect of annealing the assembly of layers. This results in one block region or domain of the block copolymers being attracted to the preferential regions 449, and the other block region or domain of the block copolymers being attracted to the preferential regions 418 thereby orienting, aligning and self-assembling or otherwise induce ordering of the block copolymers as shown. In this example, the preferential regions 449 attract or pin the non-silicon containing block region or domain 429 of the block copolymer and the preferential regions 418 attract or pin the silicon containing block region or domain 428 of the block copolymer. In alternative embodiments, both the upper and lower preferential region may attract the same block region (e.g., silicon bearing or non-silicon bearing) of the block copolymer. In other alternative embodiments, the upper and lower preferential regions may be directly above and below each other, staggered as shown in the third embodiment, or in other configurations depending on the application as can be appreciated by one of ordinary skill in the art to generate different types of structures such as lamellae cylinders, etc. For example, the upper and lower preferential regions may be aligned differently, such as forming preferential regions that are orthogonal or at a forty five degree angle to each other, to generate different types of block copolymer structures.

Now that the block copolymers are oriented and aligned through directed self-assembly, the alignment layer can be stripped as illustrated in FIG. 4M. This can be performed by the use of a chemical bath selective to the top coat or by the use of chemical mechanical polishing or other removal techniques such as etching. The block copolymers are then treated, for example by etching as illustrated in FIG. 4N resulting in the removal of one domain of (e.g., an etch selective or non-silicon bearing block 429) the block copolymer. Steps 4M and 4N may be performed in the same step by using a chemical bath or etch process which is effective in removing the top coat and the desired block of the block copolymer concurrently. Such a process may extend into the alignment layer and the underlying substrate if desired.

A variety of steps can be taken at this point to utilize these patterned block copolymer structures. These will be explained in greater detail below.

FIGS. 5A through 5I are cross sectional views of a structure during various steps for aligning and orienting block copolymers in accordance with a fourth embodiment. In this embodiment, an alignment layer is formed both above and below the block copolymers.

Figure 5A:
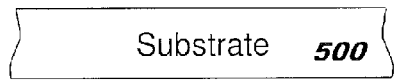
FIGS. 5A through 5I are cross sectional views of a structure during various steps used to orient and align block copolymers in accordance with a fourth embodiment.

FIG. 5A illustrates a substrate 500 from which the process starts. Substrate 500 may be a bare silicon wafer, a semiconductor device with underlying circuitry which needs a mask for further processing, disk drive media, an imprint lithography template for such a platter, which needs patterning, etc. The substrate or top layer of the substrate may be monolithic and composed of silicon, quartz, metal, glass, or other types of materials depending on the application. It is on this substrate that block copolymers may be deposited, aligned and oriented for use in patterning the underlying substrate or for building structures above the substrate. For illustrative purposes, the substrate will be silicon in this embodiment. This silicon substrate may be amorphous or crystallized depending on the application. Typically such a silicon surface will have a native oxide on the surface including pervasive silanols. Alternative embodiments can be used to handle other types of substrates.

Figure 5B:
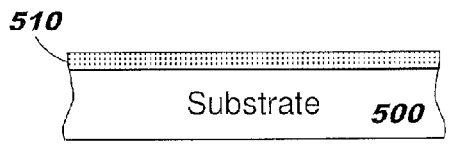

FIG. 5B illustrates the creation of a surface layer 510 formed on the substrate. This layer can serve multiple purposes. It provides a surface for the application of subsequent materials such as by spin coating or deposition. In addition, with subsequent processing such as described below, it can be utilized to form an alignment layer that assists in aligning subsequently deposited block copolymers. In this embodiment, this surface layer is physically adhered to the substrate as cross linkable layer. In an alternative embodiment, this surface layer may be chemically grafted to the substrate (e.g., covalently bonded), or a combination of grafting and cross-linking may be employed to create this layer.

In this embodiment, the alignment layer 510 is a material that is preferential to a non-silicon bearing block, although alternative embodiments may utilize a neutral material.

Figure 5C:
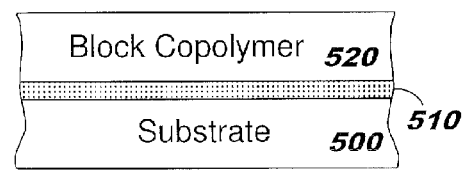

Then the block copolymer layer 520 is spin coated onto the surface layer as shown in FIG. 5C. At this point the block copolymers are typically not oriented or aligned. In this embodiment, the block copolymers chemically contain a silicon bearing block covalently bonded to a block not containing any silicon. Alternative embodiments may utilize other homopolymers, contain suspended materials or react with materials that respond selectively to etch or other removal or baking techniques.

Figure 5D:
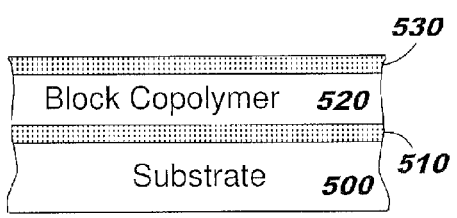

A top layer 530 containing photoacid generators (PAGs) is then spin coated and baked onto the block copolymers as shown in FIG. 5D. Other methods may be utilized for forming the top coat. With further processing as described below, this layer will later be utilized to assist in aligning subsequently deposited block copolymers. In this embodiment, the reactive top layer containing PAG is a preferential material to one of the blocks (e.g., an etch selective or non-silicon bearing block), although alternative embodiments may utilize a neutral material that is not preferential to either block. This is referred to herein as a preferential mode, which may be preferential to a first block of a copolymer, a second block of the copolymer, or neutral (or near neutral) to either block. In an alternative embodiment, alignment layer 530 may not contain photoacid generators and a subsequent PAG layer may be added as described above with reference to the first embodiment. Alternative embodiments may utilize alternative reactive agents such as a base to change the preferential mode of an alignment layer. Alternative embodiments may also utilize other types of reactive agent carriers.

Figure 5E:
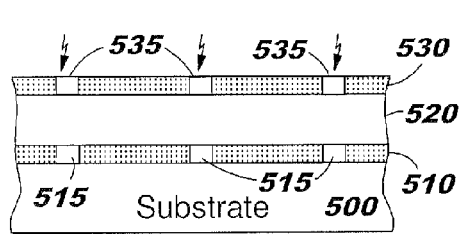

FIG. 5E illustrates the concurrent patternwise exposure of all layers to radiation with a given linewidth (e.g., using 193 nm wavelength irradiation to generate 43 nm linewidth features) thereby converting the PAGs to acid in selected regions 515 and 535 of layers 510 and 530. In this example regions 515 and 535 will be self-aligned as they are generated in a single exposure. This may be performed using standard photolithography techniques such as using a photomask in a photolithography exposure tool or by using other techniques such as ebeam exposure, etc. Regardless of the technique utilized, selected acid regions 515 and 535 are generated as shown. The distance between these selected acid bearing regions can be a multiple of a pattern length (L0) of the block copolymer for use as described below.

Figure 5F:
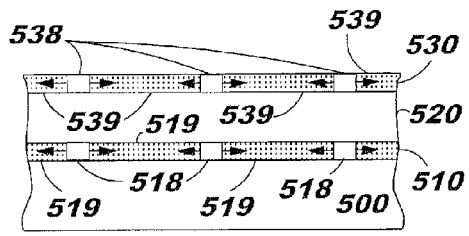
Figure 5G:
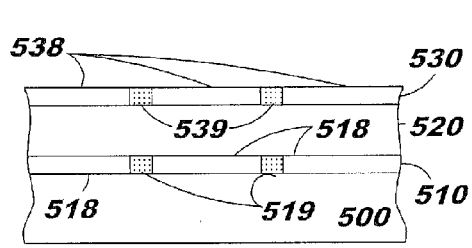

FIGS. 5F through 5G illustrate converting preferential areas of alignment layers 510 and 530 to neutral regions 518 and 538. As shown in FIG. 5F, by using a post exposure bake process the areas within acid bearing regions 515 and 535 are exposed to acid through diffusion, thereby chemically modifying those regions of the preferential layer to neutral regions 518 and 538. As illustrated in FIG. 3G, by continuing the post exposure bake process, substantial portions of the preferential areas 519 and 539 surrounding the neutral regions 338 can be converted to neutral. This can continue until the remaining preferential portions 519 and 539 of the alignment layers are narrowed to approximately one half of L0 or a multiple of 0.5 L0. This can be accomplished by the careful control of temperature and duration of the post-bake, the type of acid relative to the alignment layer composition, the density of photoacid generators, addition or base quenchers, etc. Control of this process is described in greater detail above with reference to FIG. 2. One advantage of this approach is that the remaining preferential portions may be narrower than the selected acid regions 515 and 535. As a result, the remaining preferential regions and patterned block copolymers residuals generated as described below may be smaller than generated in the primary patterning processes.

Figure 5H:
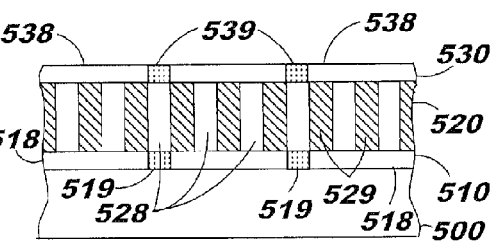

FIG. 5H illustrates the effect of annealing the current assembly of layers. This results in one block region or domain of the block copolymers being attracted to the preferential regions 519 and 539, thereby orienting, aligning and self-assembling or otherwise induce ordering of the block copolymers as shown. In this example, the preferential regions 519 and 539 attract or pin the non-silicon containing block region or domain 528 of the block copolymer. In alternative embodiments, the preferential region may attract the silicon bearing block region 529 of the block copolymer.

Figure 5I:
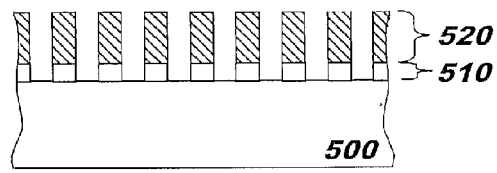

Now that the block copolymers are oriented and aligned through directed self-assembly, the alignment layer 530, non-silicon copolymer blocks 528, and exposed portions of the underlying alignment layer 510 are stripped as illustrated in FIG. 5I. This can be performed by the use of a chemical bath selective to the top coat or by the use of chemical mechanical polishing or other removal techniques such as etching. The silicon in block regions 529 can be retained as structures and converted to silicon dioxide.

A variety of steps can be taken at this point to utilize these patterned block copolymers structures. These will be explained in greater detail below.

In another embodiment, the layers 510 and 530 may not contain PAG, but PAG is incorporated into the block copolymer layer, 520. Patternwise exposure as shown in FIG. 5E creates acid containing regions in layer 520. Baking then causes diffusion of the acid into the regions 515 and 535.

One advantage of this approach is that the remaining preferential portions may be narrower than the selected acid regions 515 and 535. As a result, the remaining preferential regions and patterned block copolymers residuals generated as described below may be smaller than generated in the primary patterning processes.

FIGS. 6A through 6D are cross sectional views of a structure during various steps for aligning and orienting block copolymers in accordance with a fifth embodiment. This embodiment is a variation of the second embodiment where the block copolymers are aligned in one direction in selected areas and aligned in another direction in other areas. In this embodiment, the surface layer is neutral and not used as an alignment layer but the top layer is an alignment layer.

Figure 6A:
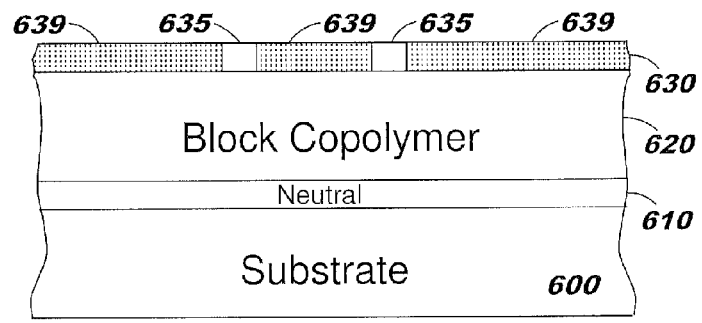
FIGS. 6A through 6D are cross sectional views of a structure during various steps used to orient and align block copolymers in accordance with a fifth embodiment.
Figure 6B:
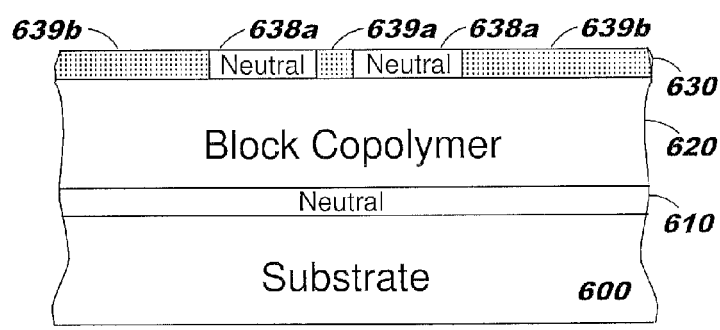

FIG. 6A illustrates the device where a substrate 600, a neutral surface layer 610, a block copolymer layer 620, and a PAG (or other type of reactive agent carrier) containing alignment layer 630 have already been formed similar to the steps described with reference to the second embodiment. The alignment layer was initially deposited as a preferential layer 639 (preferential to a non-silicon containing block) and has been exposed to radiation in selected areas 635. As the top layer is baked, the acid in those areas is diffused through the top layer as shown in FIG. 2 above, resulting in neutral areas 638, narrow preferential areas 639a and wide preferential layers 639b as shown in FIG. 5B.

Figure 6C:
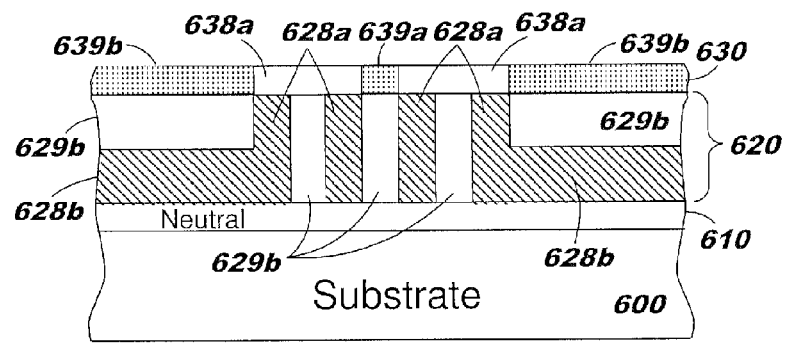
Figure 6D:
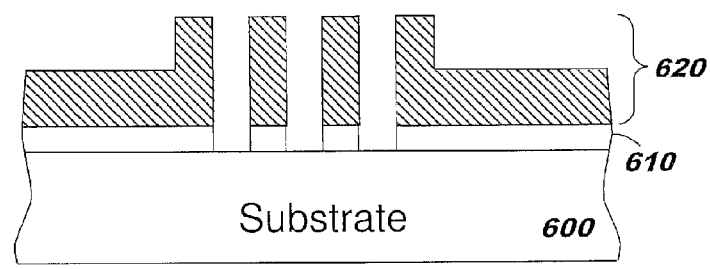

As the structure is annealed as shown in FIG. 6C, the narrow preferential area 639a will pin the non-silicon containing blocks of the block copolymers for a short distance generating block copolymer domains oriented perpendicular to the substrate with non-silicon bearing regions 629a and non-silicon bearing regions 628a. These structures may be lamellae, cylinder or other morphologies that are known in the art. Under the wide preferential areas 639b, the block copolymer domains will align in a direction with domains oriented parallel to the plane of the substrate having alternating layers of non-silicon bearing regions 629b and silicon bearing regions 628b. After an etching or other process(es) that selectively remove the non-silicon bearing regions silicon containing structures 628 remain. This creates openings ash shown in FIG. 6D that provide access to the underlying substrate. These openings can then be utilized for various processing techniques such as being used as a etch mask for patterning substrate 600 or other desired purposes as can be appreciated by one of ordinary skill in the art. The surrounding areas of the substrate may then be protected from such processes.

One advantage of this embodiment is that the openings 690 may be narrower than the selected acid regions 635. As a result, the openings 690 generated as described above may be smaller than generated using current patterning processes. Another possible advantage of this embodiment is that large horizontal silicon structures where there were no vertical domains (such as 628b) can be utilized for other purposes such a for forming indicia useful in hard disk drive servo patterns, or for the formation of other useful circuitry.

In an alternative embodiment, the areas under 628B in FIG. 6C may have also been altered to preferential regions for a silicon bearing block similar to the processes described in the first or third embodiments, which could more strongly affix the silicon bearing regions to the underlying surface layer at those locations.

Figure 7:
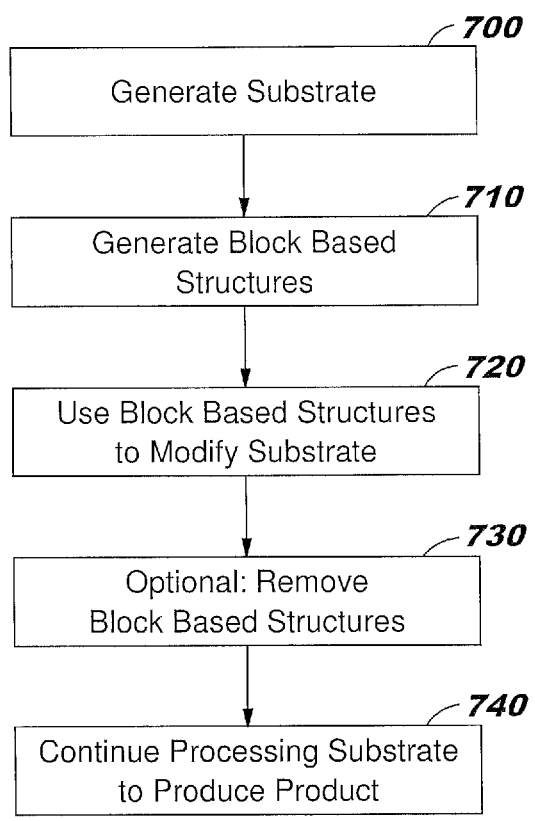
FIG. 7 is a flow diagram of the steps used to create a pattern utilizing aligned block copolymers in which various embodiments may be implemented that is useful in manufacturing of certain devices.

FIG. 7 is a flow diagram of the steps used to create a pattern utilizing aligned block copolymers in which various embodiments may be implemented that is useful in manufacturing of certain devices. In a first step 700, a substrate is generated. This may be a bare silicon wafer, a metal or ceramic disk platter, a semiconductor wafer containing underlying circuitry, etc. In a second step 710, block based structures are generated, such as shown in the first through fourth embodiments described above or in alternative embodiments such one of ordinary skill in the art would appreciated from the descriptions herein. These structures may be silicon based or other materials such a metal, glass, quartz, etc. In a third step 720, those block based structures are then utilized to modify or supplement the underlying substrate. In an optional step 730, the block based structures may then be removed. Alternatively, those structures or portions thereof may be retained for further processing or use. Finally, in step 740 the resulting device is then further processed to produce a manufactured product using processes well known to those of ordinary skill in the art. These processes could include again utilizing the processes described above with reference to step 710 through 730.

Figure 8A:
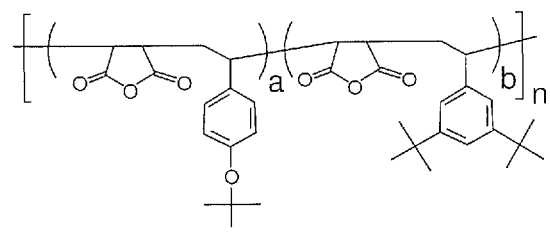
FIGS. 8A through 8C are illustrations of photopatternable alignment layer materials and their usage in which various embodiments may be implemented.
Figure 8B:
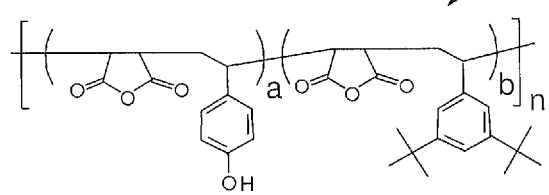
Figure 8C:
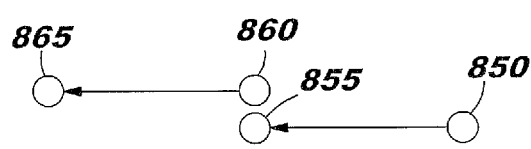
Figure 9:
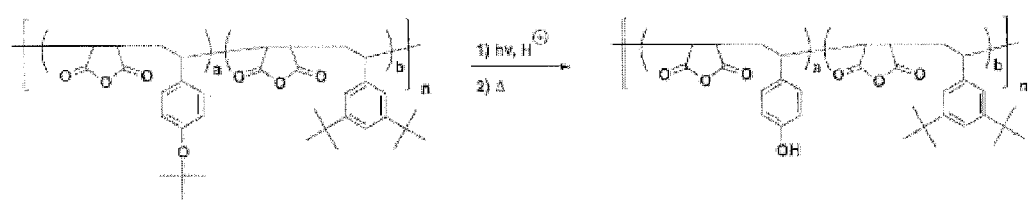
FIG. 9 presents one embodiment of an incident irradiation method to create a photo-patternable surface treatments (GTC) and photopatternable top coats.
Figure 10:
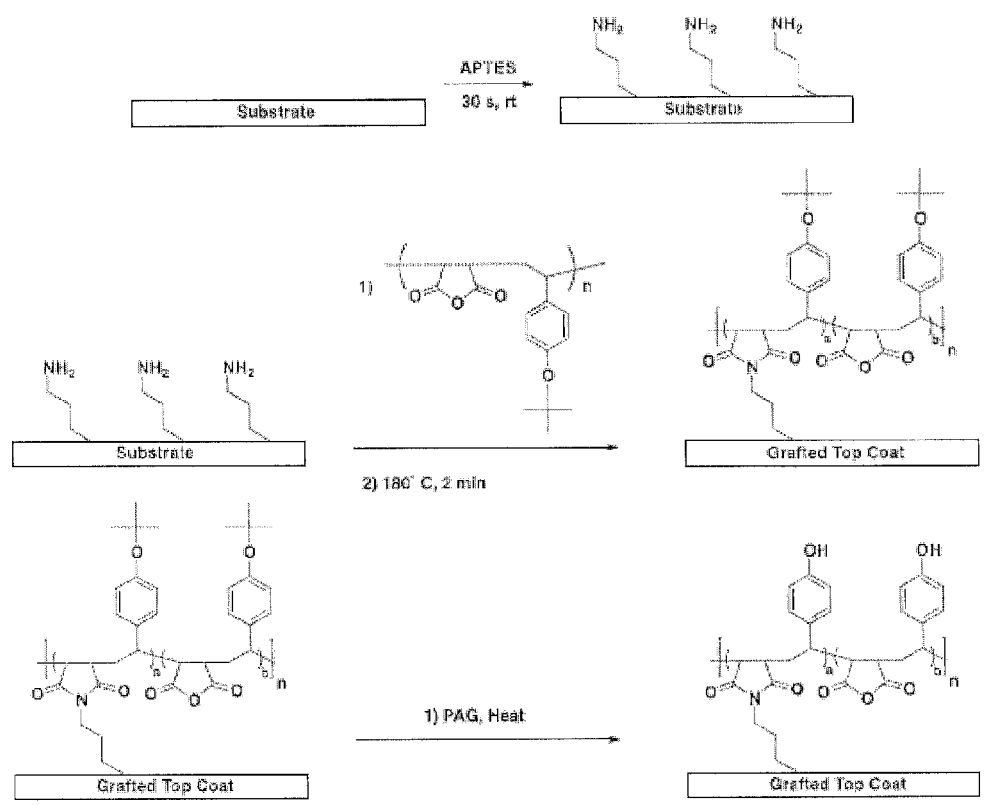
FIG. 10 presents illustrative embodiments to create grafted top coat polymer layers.
Figure 11:
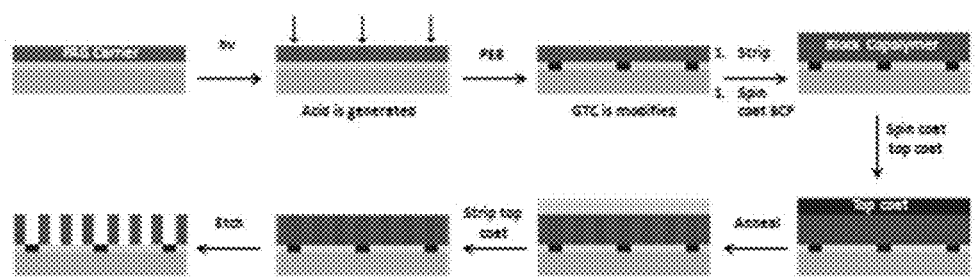
FIG. 11 presents one embodiment to create an etched photo-patternable grafted top coat comprising aligned block copolymers using an irradiation photo-acid generator process.
Figure 12:
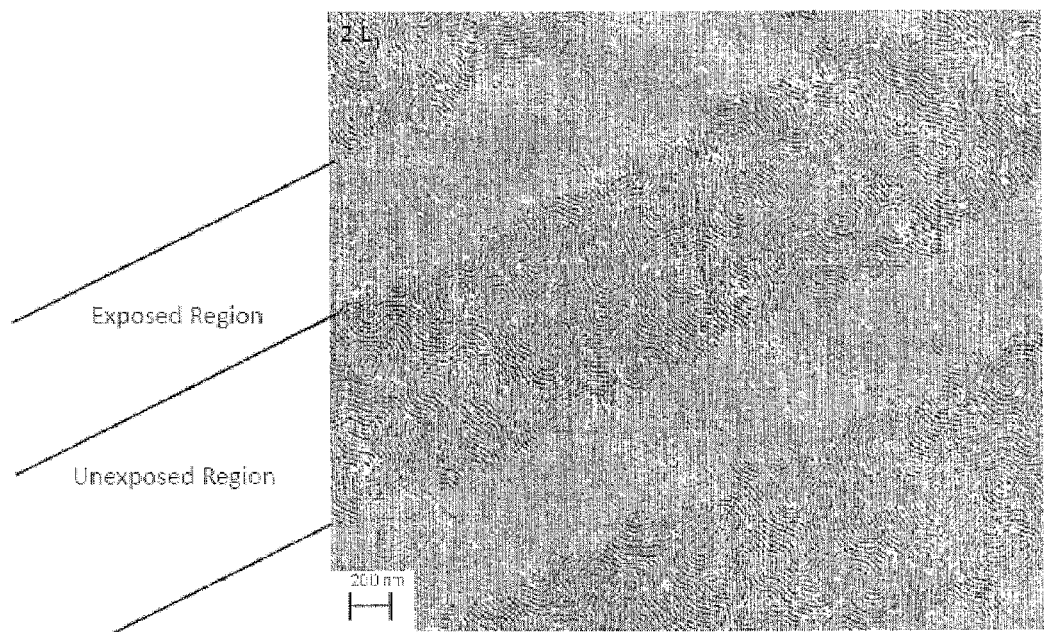
FIG. 12 presents exemplary data showing a photomicrograph of contact printing made by incident irradiation polymer alignment methods as disclosed herein.
Figure 13:
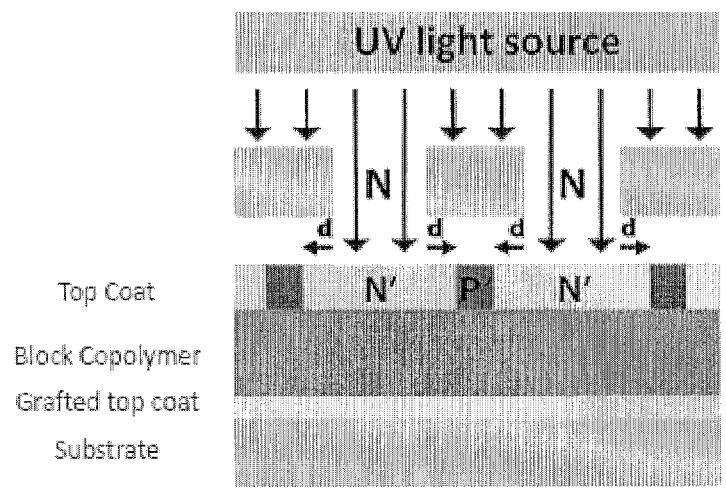
FIG. 13 illustrates copolymer-specific etching resulting from an incident irradiation step. This method has several advantages, including but not limited to: 1) Simpler—less processing steps 2) Sub-lithographic resolution patterns can be achieved; and 3) No surface topography.
Figure 14:
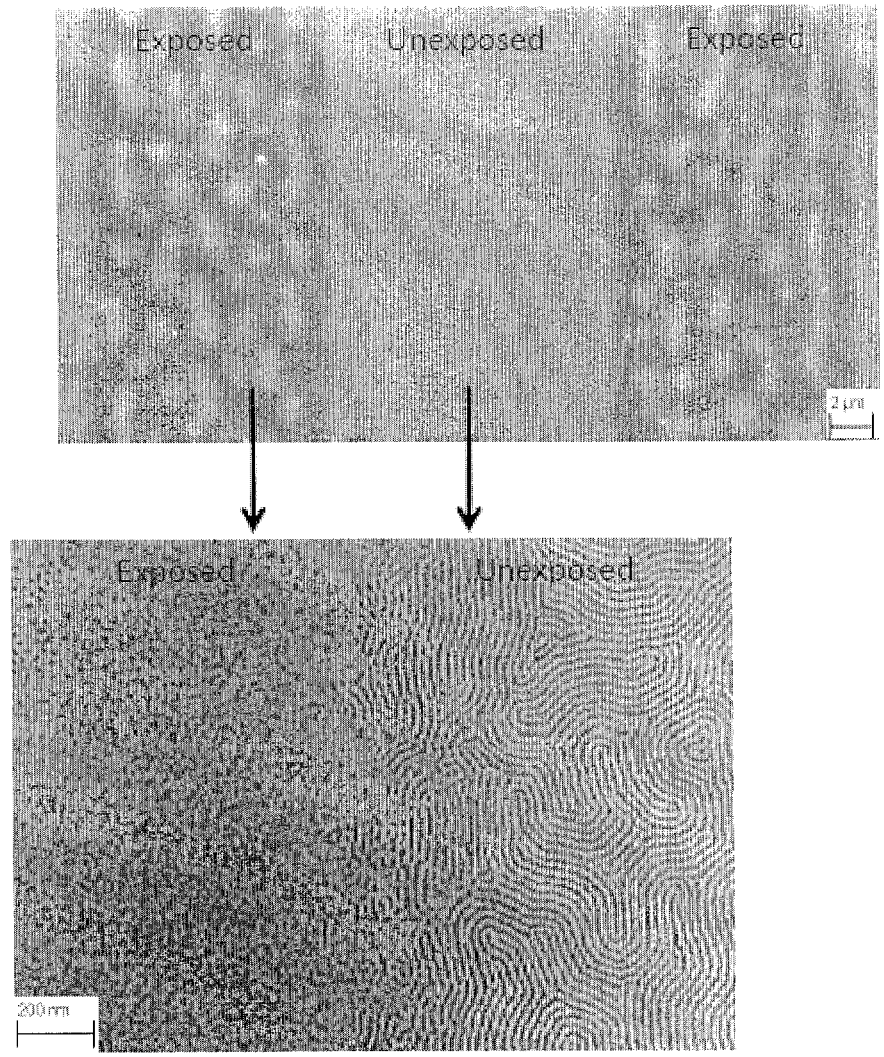
FIG. 14 presents exemplary data showing photomicrographs before and after incident irradiation. The block copolymers in the unexposed regions are perfectly perpendicular, while the block copolymers in the exposed regions go parallel.

FIGS. 8A through 8C are illustrations of photopatternable alignment layer materials and their usage in which various embodiments may be implemented. These materials could be utilized in a surface alignment layer or in a top coat such as described above. FIG. 8A illustrates the general chemical composition of a material which can easily be configured to be more polar or non-polar as could be appreciated by one of ordinary skill in the art. As this material is exposed to acid and heat, it will be chemically modified to a more polar material as shown in FIG. 8B.

FIG. 8C illustrates the use of these materials. If the material of FIG. 8A is initially set to be partially non-polar preferential material 850, then exposing that material to acid and heat will adjust that material to a neutral material 855. If the material of FIG. 8A is initially set to be a neutral material 860, then exposing that material to acid and heat will adjust that material to a polar preferential material 865.

Although this material generally moves to the left in the graph of FIG. 8C when exposed to acid and heat, other materials can be utilized that move to the right when exposed to acid and heat. Other types of reactive agents may be utilized such as a base. In addition, other types or preferential materials can be utilized to attract or repel certain types of copolymer blocks. Many of these types of materials are known to those of ordinary skill in the art.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of aligning and orienting block copolymers comprising:
   a) providing a block copolymer comprising repeat units of block A and block B, a substrate, and materials for forming layers;
   b) forming a first layer on said substrate that either preferentially wets block A of said block copolymer, or is neutral and does not preferentially wet either block of said block copolymer, said first layer comprising a reactive agent carriers;
   c) forming a block copolymer layer on top of and adjoining said first layer;
   d) before or after step c), selectively irradiating said reactive agent carriers of said first layer in a pattern whereby the irradiated reactive agent carriers provide the reactive agent into the selected regions of the first layer so as to modify the preferential wetting of said selected regions;
   e) application of a topcoat on top of the block copolymer layer so as to create an assembly; and
   f) treating said assembly so as to orient and align the block copolymer.

2. The method of claim 1, wherein said treating comprises thermal annealing.

3. The method of claim 1, wherein said topcoat does not preferentially wet either block of said block copolymer.

4. The method of claim 1, wherein said topcoat does preferentially wet either block of said block copolymer.

5. The method of claim 1, wherein said method further comprises treating said first layer such that the reactive agents are diffused, thereby enlarging in size of the selected regions of the first layer and reducing in size the other regions of the first layer.

6. The method of claim 1, wherein said reactive agent carriers are introduced into said first layer after it is formed in step b).

7. The method of claim 1, wherein said reactive agent carriers are introduced into said topcoat layer after it is formed in step d).

8. The method of claim 1, wherein said reactive agent carriers are photoacid generators.

9. The method of claim 1, wherein said reactive agent is an acid.

10. The method of claim 1, wherein said reactive agent is a base.

* * * * *